United States Patent [19]
Seligson

[11] Patent Number: 5,266,445
[45] Date of Patent: Nov. 30, 1993

[54] METHOD OF SELECTIVELY IRRADIATING A RESIST LAYER USING RADIATION PULSES

[75] Inventor: Daniel A. Seligson, Palo Alto, Calif.

[73] Assignee: Intel Corporation, Santa Clara, Calif.

[21] Appl. No.: 785,944

[22] Filed: Oct. 31, 1991

[51] Int. Cl.$^5$ .......................... G03C 5/00; G03C 5/06
[52] U.S. Cl. .................................... 430/311; 430/312; 430/394; 430/396; 430/397; 355/53; 355/77
[58] Field of Search ................. 430/22, 311, 312, 394, 430/396, 397, 945; 355/53, 77

[56] References Cited

U.S. PATENT DOCUMENTS

| | | | |
|---|---|---|---|
| 4,021,239 | 5/1977 | Ogawa | 430/397 |
| 4,884,101 | 11/1989 | Tanimoto | 355/53 |
| 4,924,257 | 5/1990 | Jain | 355/53 |

FOREIGN PATENT DOCUMENTS

| | | | |
|---|---|---|---|
| 1-129416 | 5/1989 | Japan | 430/397 |
| 1-216530 | 8/1989 | Japan | 430/397 |
| 2155650 | 9/1985 | United Kingdom | 355/53 |

*Primary Examiner*—Marion E. McCamish
*Assistant Examiner*—Kathleen Duda
*Attorney, Agent, or Firm*—Blakely, Sokoloff, Taylor & Zafman

[57] ABSTRACT

A method of forming a patterned resist layer on a semiconductor substrate is described. The substrate is coated with a resist layer and placed on a substrate stage in a lithographic printer. The lithographic printer includes a pulsed radiation source that emits a radiation pulse lasting a pulse time and has a recovery time between two consecutive radiation pulses. The printer has a reticle disposed between the radiation source and the resist layer. The substrate is aligned to the reticle. A stepping field of the resist layer is patterned using a plurality of radiation pulses during multiple passes of the reticle over the stepping field. The substrate moves relative to the reticle at a predetermined velocity during each of the radiation pulses. The substrate motion relative to the reticle is configured so that the radiation source emits a radiation pulse when the center of the reticle is over about the center of the stepping field. A substantially patterned resist layer is formed faster and with less misalignment variance compared to the prior art.

8 Claims, 6 Drawing Sheets

METHOD OF SELECTIVELY IRRADIATING A RESIST LAYER USING RADIATION PULSES

FIELD OF THE INVENTION

The present invention relates generally to the field of patterning semiconductor devices, and in particular, to the formation of a patterned resist layer that is selectively patterned using a reticle and a plurality of radiation pulses.

BACKGROUND OF THE INVENTION

Within the semiconductor industry, a number of prior art methods are available for patterning a resist layer. The following is a description of just one type of method commonly used for patterning a resist layer when using a pulsed radiation source. A substrate is coated with a resist layer and placed on a substrate stage in a lithographic printer. The lithographic printer has a pulsed radiation source and a reticle that is disposed between the radiation source and the resist layer. The reticle has transparent and opaque sections that correspond to the desired pattern to be printed within the resist layer.

The substrate is aligned to the reticle. The aligning procedure is an active process where the printer acquires the position of predetermined alignment marks of the reticle and the substrate, so that the printer can locate any position on the substrate. This aligning process includes methods such as global alignment and enhanced global alignment which are well known in the art. After aligning, the substrate stage is moved to the first area of the resist layer to be patterned. The printer may locally align to the first area to adjust for errors that occur when moving the stage. The substrate stage is positioned, substantially stops moving and is allowed to settle, and the radiation source emits a pulse of radiation. When exposed to the radiation pulse, the transparent sections of the reticle allow a significant amount of the radiation to pass through the reticle, and the opaque sections prevent substantially all of the radiation from reaching the resist layer, thereby patterning the resist layer. The substrate stage moves a predetermined distance to the next area to be patterned, the substrate stage may be locally aligned to the second area, the substrate stage substantially stops moving and is allowed to settle, and another radiation pulse is emitted causing another portion of the resist layer to be patterned. This type of method for patterning the resist layer is sometimes referred to as "step and repeat" or "stepping". The lithographic printer used for the method is called a "stepper", and the area of the resist layer under the reticle during a radiation pulse is a "stepping field". The stepper typically patterns a resist layer that includes a plurality of stepping fields.

The prior art method of patterning a resist layer consumes time that reduces machine throughput and puts stress on precision mechanical parts that control substrate stage position. FIG. 1 is an illustration of the relative movement of the reticle with respect to a substrate 10 using the prior art method. The stepping path 11 is shown by a dashed line with directional arrows. Every time the substrate is substantially stopped in the x-direction or the y-direction, an "x" is marked across the path 11. Each radiation pulse is shown as a "|" marked across and normal to the path. The marks in FIG. 1 that appear to be asterisks are an "x" superimposed over a "|", meaning that the substrate is substantially stopped relative to the reticle during a radiation pulse. A six-inch diameter wafer typically has about 50 stepping fields. Therefore, the substrate stage may be started and stopped about 50 times per substrate.

In a lithographic printer employing a pulsed radiation source, a plurality of radiation pulses may be needed to pattern a resist layer because each pulse has a significant amount of noise or the radiation dose for a pulse is not enough to substantially pattern the resist layer. Each stepping field is substantially patterned using N radiation pulses, where each radiation pulse has 1/N of the total radiation dose needed to substantially pattern the resist layer. In a prior art process, the first stepping field is substantially patterned with all of its radiation pulses before the substrate is realigned or moved to another stepping field. The total time needed to substantially pattern a stepping field by the prior art method is approximated by the following equation:

$$t_{PA} = N(t_P + t_R) + t_{ST} + t_S$$

where $t_{PA}$ is the total time using prior art methods;
N is the number of radiation pulses per stepping field;
$t_P$ is the time of a radiation pulse; and
$t_R$ is the recovery time between two consecutive pulses.
$t_{ST}$ is time to move between stepping fields; and
$t_S$ is the substrate stage settling time.

In a currently available pulsed x-ray stepper such as one made by Hampshire Instruments, a pulse time is between about 2 ns to 20 ns, the recovery time is tenths of a second, and the step and settle time (combination of the time to move between stepping fields and the substrate stage settle time) is at least a tenth of a second.

The misalignment variance using the prior art method is about:

$$(s_{PA})^2 = (s_S)^2 + (s_R)^2$$

where $s_{PA}$ is the total variance using the prior art method;
$s_S$ is the variance of the systematic errors; and
$s_R$ is the variance of the random errors.

SUMMARY AND OBJECTS OF THE INVENTION

In view of the foregoing, one object of the present invention is to reduce the time needed to pattern a resist layer.

It is an additional object of the present invention to decrease the misalignment variance due to random errors.

A method of forming a patterned resist layer on a semiconductor substrate is described. The substrate is coated with a resist layer and placed on a substrate stage in a lithographic printer. The lithographic printer includes a pulsed radiation source that emits a radiation pulse lasting a pulse time and has a recovery time between two consecutive radiation pulses. The printer has a reticle disposed between the radiation source and the resist layer. The substrate is aligned to the reticle. A stepping field of the resist layer is patterned using a plurality of radiation pulses during multiple passes of the reticle over the stepping field. The substrate moves relative to the reticle at a predetermined velocity during each of the radiation pulses. The substrate motion relative to the reticle is configured so that the radiation source emits a radiation pulse when the center of the reticle is over about the center of the stepping field. A substantially patterned resist layer is formed faster and with less misalignment variance compared to the prior art.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention forms a patterned resist layer on a semiconductor substrate using a plurality of radiation pulses during multiple passes of a reticle relative to and over the resist layer where each radiation pulse occurs while the substrate is in motion relative to the reticle. The advantages of the current invention include higher equipment throughput and a smaller misalignment variance compared to the prior art. The present invention allows an increased mask distortion error budget. The present invention can be used with a lithographic printer having a pulsed radiation source.

Figure 1:
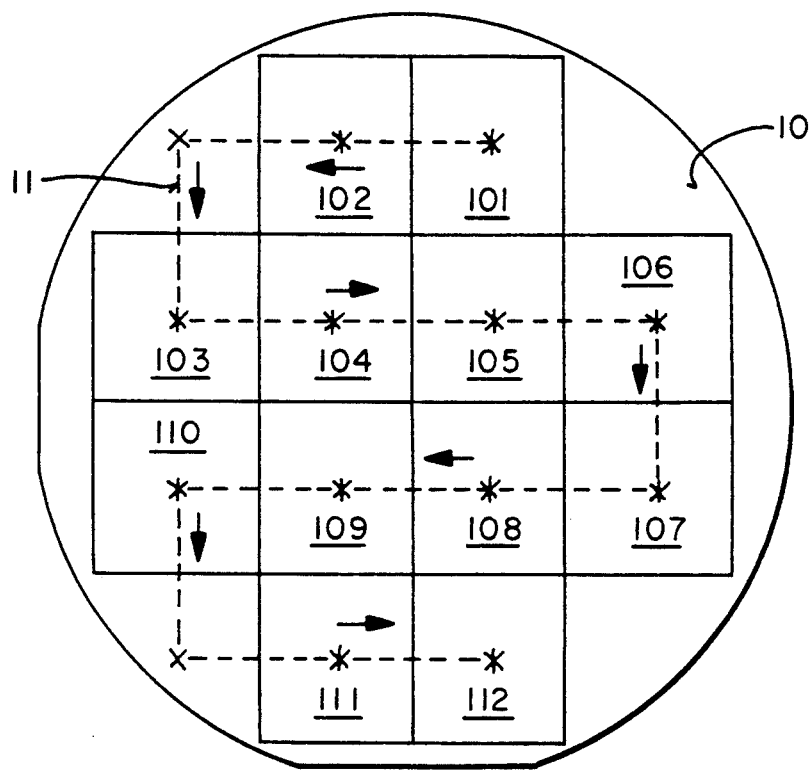
FIG. 1 illustrates an aerial view of a substrate stepping pattern using a prior art method.
Figure 2:
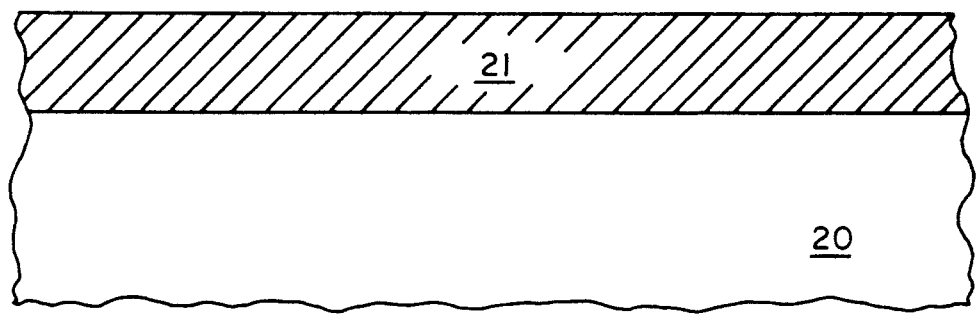
FIG. 2 shows a cross-sectional view of a portion of a substrate coated with a resist layer.

In the currently preferred embodiment of the present invention, a semiconductor substrate 20 is coated with a resist layer 21 about 1 $\mu$m thick, as shown in FIG. 2. The resist layer 21 is sensitive to radiation having a wavelength of about 1 nm to about 1.7 nm long. The substrate is placed on a substrate stage in a lithographic printer such as a x-ray stepper having a pulsed radiation source that emits a radiation pulse lasting a pulse time and has a recovery time between two consecutive pulses. Hampshire Instruments makes a pulsed x-ray stepper that emits a pulse of x-ray radiation having a wavelength of about 1 nm to about 1.7 nm. The lithographic printer has a reticle disposed between the radiation source and the resist layer. The reticle has transparent and opaque sections that correspond to the desired pattern to be formed within the resist layer.

Figure 3:
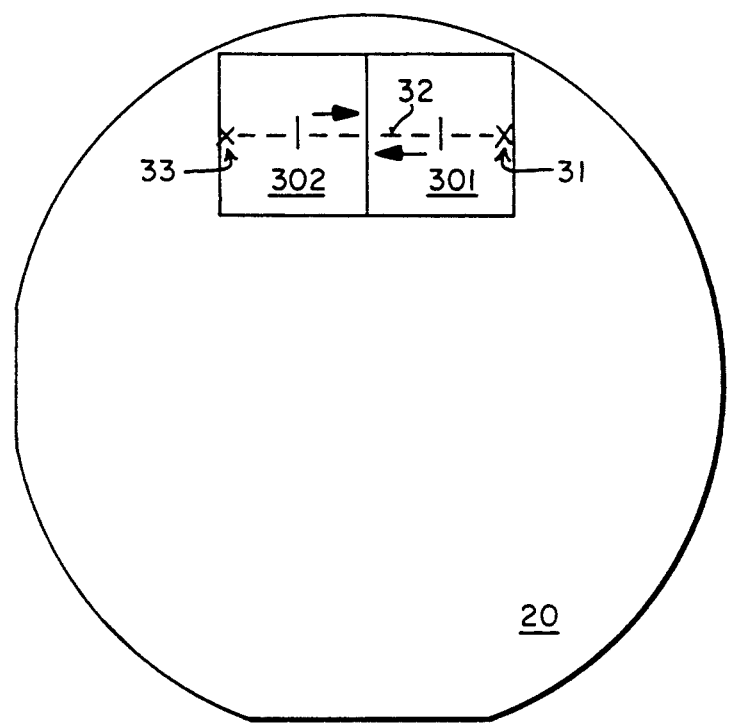
FIG. 3 depicts an aerial view of a substrate while a first row of stepping fields is patterned using the currently preferred embodiment of the present invention.

The substrate 20 is aligned to the reticle using well known methods. Referring to FIG. 3, the substrate stage is moved to a first row endpoint 31. The substrate stage is then moved so that the relative reticle position corresponds to relative reticle path 32. The substrate stage moves continuously at a substantially constant velocity until the substrate reaches first row endpoint 33. A first radiation pulse is emitted when the center of the reticle passes over about the center of stepping field 301. A second radiation pulse is emitted when the center of the reticle is over the about center of stepping field 302. At the endpoint 33, the substrate stage direction is reversed and follows the a similar path to the endpoint 31. A third radiation pulse is emitted when the center of the reticle is over about the center of stepping field 302, and a fourth radiation pulse is emitted when the reticle is over about the center of stepping field 301.

The velocity of the substrate stage is adjusted so that the time it takes to move the center of the reticle from over the center of stepping field 301 to over the center of stepping field 302 is about the same as the sum of the pulse time and the recovery time. The position of the endpoint 33 is set so that the time it takes to move from the center of stepping field 302 at the predetermined velocity to the endpoint 33 and back to the center of stepping field 302 at the predetermined velocity is about the sum of a pluse time and a recovery time. The position of the endpoint 31 is determined in a similar manner except that the path is from the center of stepping field 301 to the endpoint 31 and back to the center of stepping field 301.

The substrate moves back and forth during multiple passes along the relative reticle path 32 until the first row of stepping fields is substantially patterned. A transparent section of the reticle allows a significant amount of radiation to reach the resist layer lying beneath the transparent section to form an exposed region in the resist layer. An opaque section of the reticle prevents substantially all of the radiation from passing through the reticle and reaching the resist layer lying beneath the opaque section to form a substantially unexposed region in the resist layer. The device patterns of the stepping fields are not shown. The number of radiation pulses needed to substantially pattern the resist layer is about equivalent to the total radiation dose needed to substantially pattern the resist layer divided by about the radiation dose incident on the exposed region of the resist layer from a radiation pulse.

Figure 4:
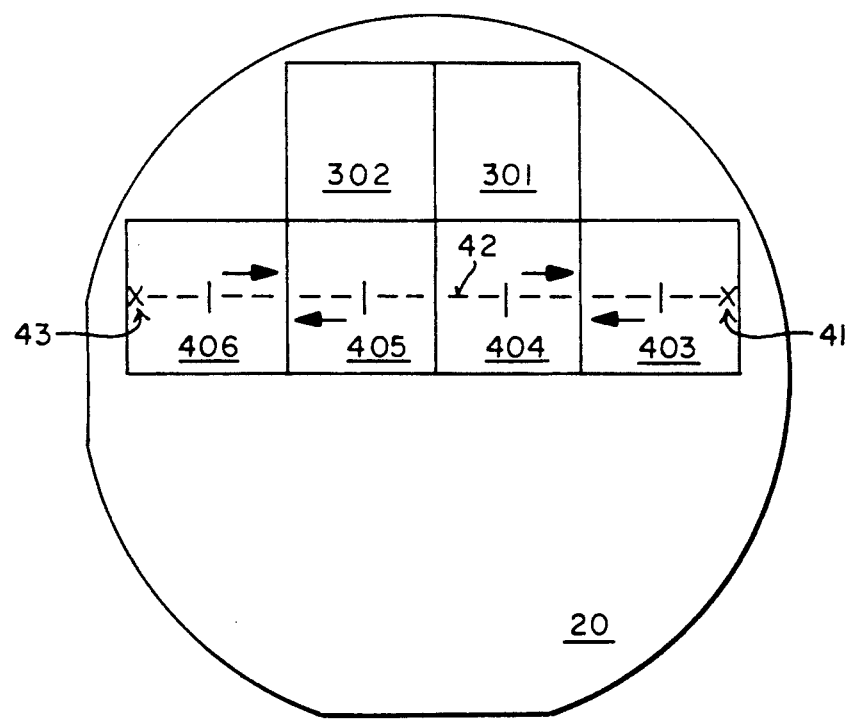
FIG. 4 shows an aerial view of the substrate in FIG. 3 while a second row of stepping fields is patterned using the currently preferred embodiment of the present invention.

The second row, which is immediately adjacent to the first row as shown in FIG. 4, is patterned. The substrate stage moves to second row endpoint 41. The stage moves continuously across the second row at a substantially constant velocity along relative reticle path 42 to second row endpoint 43. The distances between the center of stepping field 403 and the center of stepping field 404, between the center of stepping field 404 and the center of stepping field 405, and between the center of stepping field 405 and the center of stepping field 406 are about the same. The velocity of the substrate stage is adjusted so that the time it takes to move from center of stepping field 403 to the center of stepping field 404 is about the same as the sum of the pulse time and the recovery time. A pulse of radiation is emitted each time the center of the reticle is over about the center of the stepping fields 403, 404, 405, or 406. The second row endpoints 41 and 43 are determined in a manner similar to the first row endpoints 31 and 33. The substrate stage moves back and forth during multiple passes along the relative reticle path 42 until the second row of stepping fields is substantially patterned.

Figure 5:
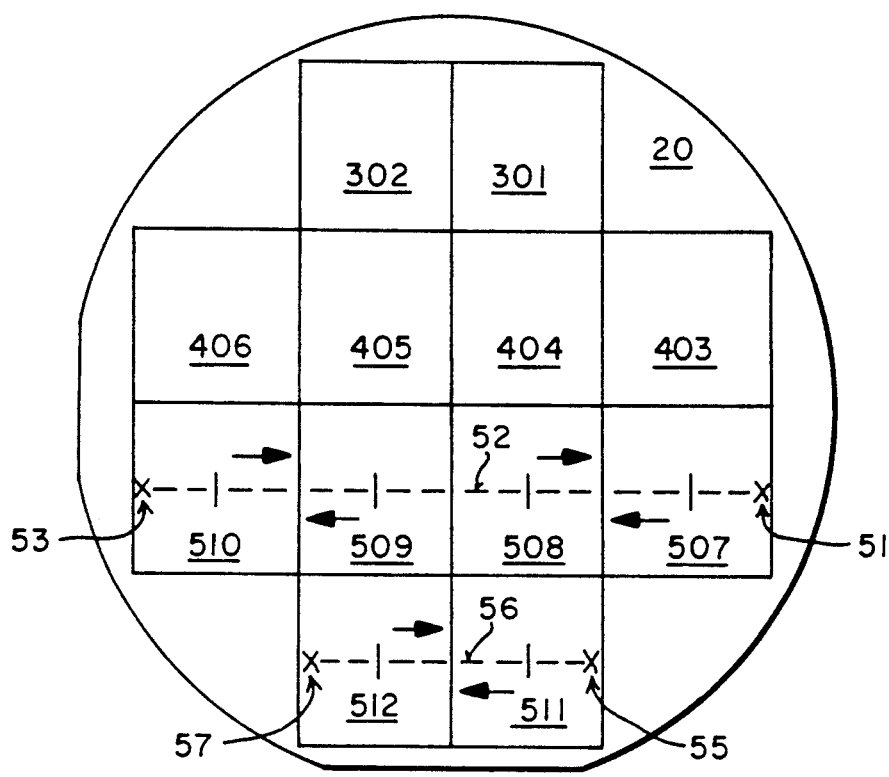
FIG. 5 shows an aerial view of the substrate in FIG. 4 after the rest of the substrate is patterned using the currently preferred embodiment of the present invention.
Figure 6:
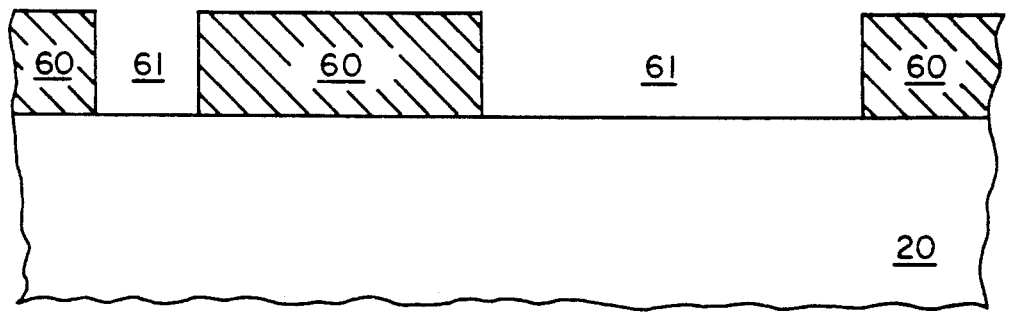
FIG. 6 illustrates a cross-sectional view of the substrate in FIG. 5 after developing and baking the resist layer in accordance with the currently preferred embodiment of the present invention.

The rest of the substrate is patterned in a similar manner as illustrated in FIG. 5. The third row includes stepping fields 507, 508, 509, and 510. The third row relative reticle path 52 has endpoints 51 and 53. The fourth row includes stepping fields 511 and 512. The fourth row relative reticle path 56 has endpoints 55 and 57. After all stepping fields on the substrate are substantially patterned, the substrate is removed from the printer, developed, and baked using well known methods to give a resist layer profile as illustrated in FIG. 6. Over the substrate 20 are resist members 60 and openings 61 between the resist members.

The total time needed to substantially pattern a stepping field using the present invention is about:

$$t_{FF} = N(t_P + t_R)$$

where $t_{FF}$ is the total time using the present invention;
N is the number of radiation pulses per stepping field;
$t_P$ is the time of a radiation pulse; and
$t_R$ is the recovery time between two consecutive pulses.

Figure 7:
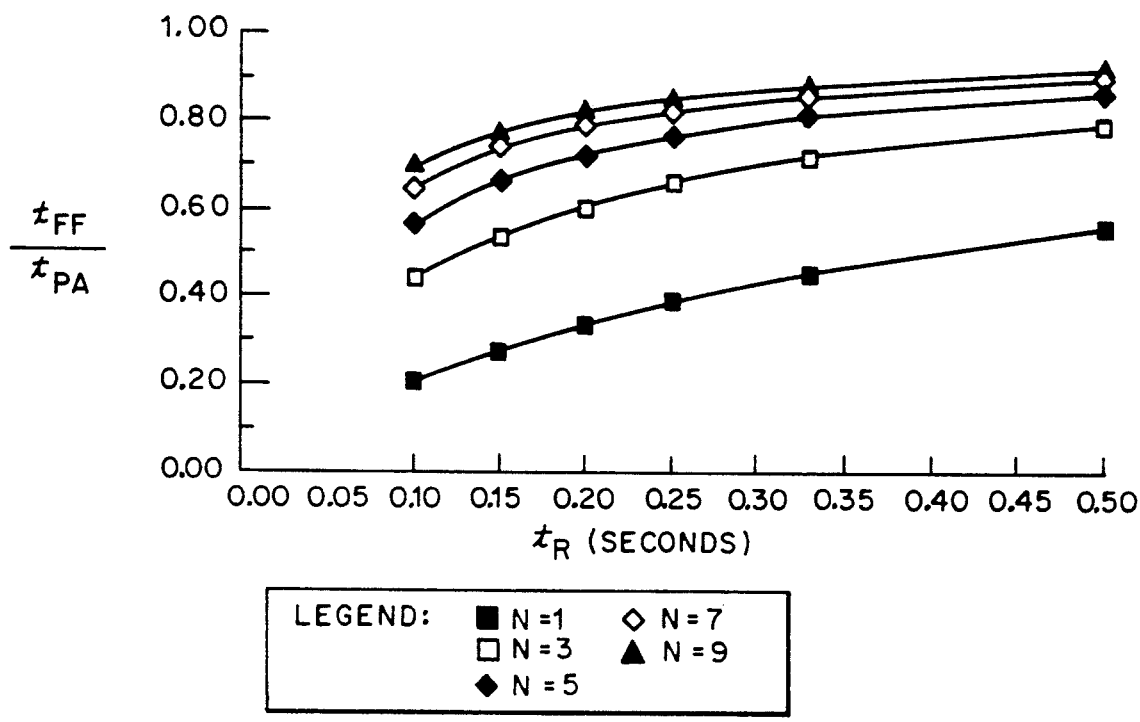
FIG. 7 shows a graph illustrating the time advantage using the present invention.

The pulse time is typically about 2 ns to about 10 ns, and the recovery time between pulses is typically a few tenths of a second. Therefore, the pulse time can effectively be ignored because the recovery time between pulses is typically much larger than the pulse time. FIG. 7 includes a graph showing the advantage using the present invention compared to the previously described prior art method. The x-axis is the recovery time and the y-axis is the fraction of the total time needed to substantially pattern a stepping field using the present invention divided by the total time needed to substantially pattern a stepping field using the previously described prior art method. For example, a resist layer needs five radiation pulses to become substantially patterned and the recovery time between pulses is about 0.2 seconds. The present invention has a total time per stepping field that is about 71% of the total time per stepping field using the previously described prior art method. The fraction of total patterning times decreases as the recovery time is shorter and as the resist layer needs fewer radiation pulses to become substantially patterned.

The currently preferred embodiment of the present invention uses "voting by positioning". Voting by positioning means that the substrate stage is moved between two consecutive radiation pulses for any single stepping field. Referring to FIG. 3, the stepping field 301 receives a radiation pulse. The substrate stage moves the relative reticle position from about the center stepping field 301 1) to the first row endpoint 31 and back to about the center of stepping field 301 before the stepping field 301 receives its next radiation pulse, or 2) to stepping field 302, to first row endpoint 33, to stepping field 302, and back to about the center 301 before the stepping field 301 receives its next radiation pulse. The misalignment variance when using the currently preferred embodiment of the present invention is about:

$$(s_{FF})^2 = (s_S)^2 + (s_R^2)/N$$

where $s_{FF}$ is the total variance using the present invention,
$s_S$ is the variance of the systematic errors,
$s_R$ is the variance of the random errors; and
N is the number of times voted.

The preceding equation assumes that all random errors are due to positioning the substrate relative to the reticle.

Figure 8:
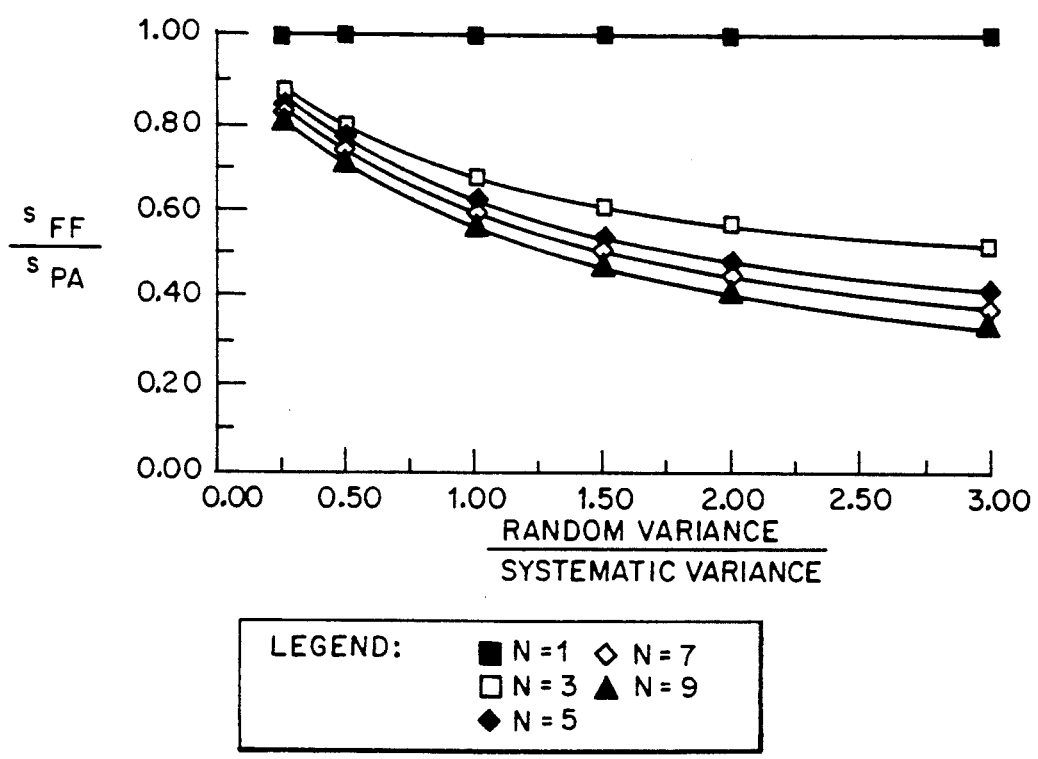
FIG. 8 depicts a graph illustrating the reduction in misalignment variance using the present invention.

FIG. 8 is a graph illustrating the improvement in misalignment variance using the currently preferred embodiment of the present invention compared to the previously described prior art method. The x-axis is the fraction of variance of the random errors divided by the variance of the systematic errors. The y-axis is the fraction of the total variance of present invention divided by the total variance using the prior art method previously described. When N is unity, the method is similar to the prior art method because only one positioning is used when patterning the resist layer. When N is greater than one, the present invention reduces the random error variance. For example, a resist layer needs five radiation pulses to become substantially patterned and the variance of the random errors is about the same as the variance of the systematic errors. The present invention has a total variance that is about 62% of the total variance using the prior art method.

Figure 9:
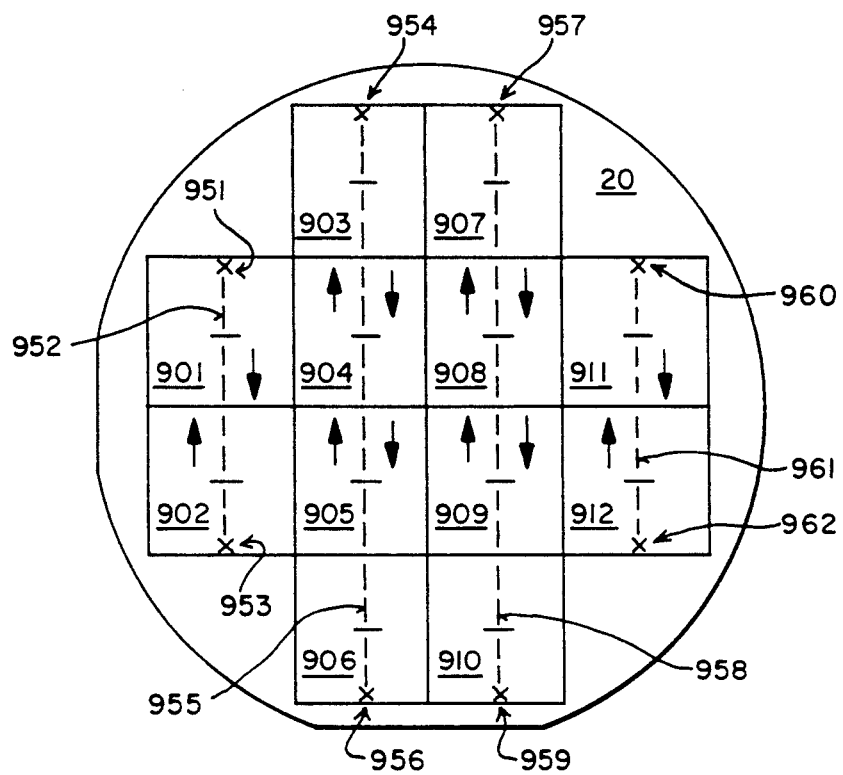
FIG. 9-11 illustrate aerial views of substrate stepping patterns using alternate embodiments of the present invention.
Figure 10:
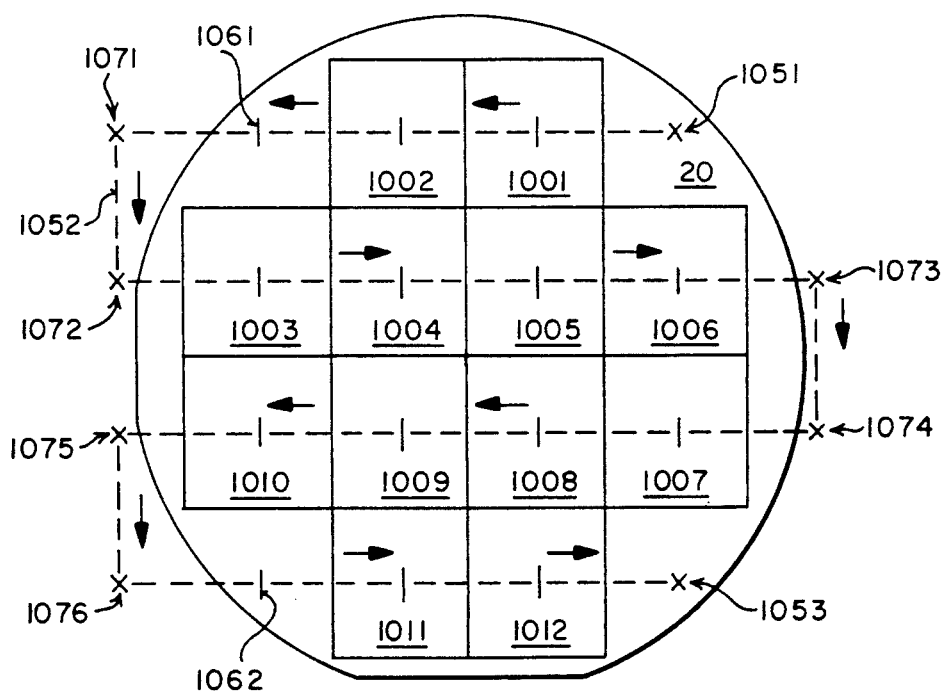
Figure 11:
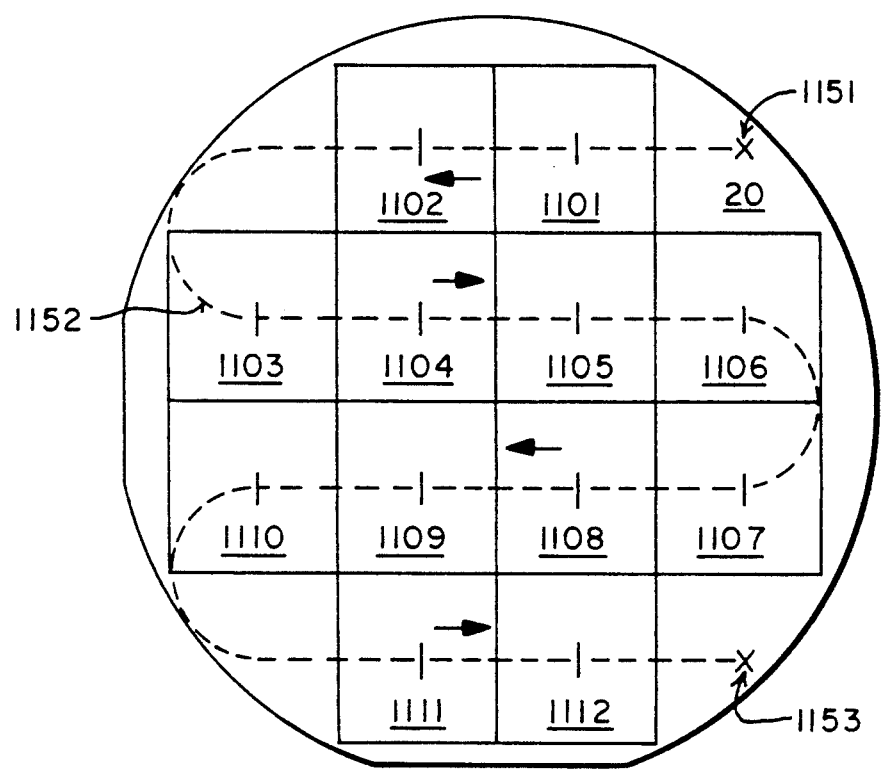

FIGS. 9, 10, and 11 illustrate alternate embodiments of the present invention. FIG. 9 patterns stepping fields by columns instead of by rows as in the currently preferred embodiment of the present invention (FIGS. 3, 4, and 5). A line of stepping fields includes a column of stepping fields or a row of stepping fields. The selection of rows or columns is determined in part by the relative accuracy of the mechanical precision parts used to position the substrate stage. If the row positioning accuracy is better than the column positioning accuracy, the currently preferred embodiment of the present invention should be used. If the column positioning accuracy is better, the column embodiment may be used.

FIG. 10 illustrates an alternate embodiment of the present invention where all stepping fields receive a radiation pulse before any of the stepping fields receives a second radiation pulse. FIG. 10 may be used in a pulsed radiation system requires an extended break (longer than a recovery time) between a set of radiation pulses. For example, if a pulsed radiation source can emit 20 radiation pulses before requiring an extended break, the embodiment of the present invention in FIG. 10 may be selected. In this manner, all of the stepping fields on the substrate receive a radiation pulse, the pulsed radiation source rests during its extended break, and then all of the stepping fields receive a second radiation pulse. The substrate may be realigned to the reticle during the extended break. The substrate is not patterned during radiation pulses at points 1061, 1062, 1071, 1072, 1073, 1074, 1075, and 1076 because a shutter between the radiation source and the substrate is closed. If desired, the shutter may be opened, but only part of a stepping field in the resist layer is patterned by each radiation pulse at those points.

FIG. 11 illustrates an example of an alternate embodiment of the present invention. The substrate stage starts at endpoint 1151, moves along the relative reticle path 1152, and stops at endpoint 1153. Instead of stopping at the end of a row, the alternate embodiment continues to move at the end of the rows. The path 1152 is a substantially continuous line without any sharp bends or corners. The time needed to move the center of the reticle from the center of a stepping field on one row to the center of a stepping field on an immediately adjacent row should be about the same as the sum of the pulse time and the recovery time. The stage moves the center of the reticle from the center of stepping field 1102 to the center of stepping field 1103 in a time about equivalent to the sum of a pulse time and a recovery time, and the stage moves from the center of stepping field 1106 to the center of stepping field 1107 during about the same amount of time. As can be seen in FIG. 11, the distance from the center of stepping field 1102 to the center of stepping field 1103 is longer than the distance from the center of stepping field 1106 to the center of stepping field 1107. The velocity of the substrate stage when moving between immediately adjacent rows is changed so that the time it takes to move the relative reticle position from the center of any stepping field to the center of another stepping field is about the sum of the pulse time and recovery time.

The present invention may be used when the the substrate velocity is no greater than the dimensional tolerance of the patterned layer divided by the pulse time. The concept is best illustrated with an example. A patterned resist layer has its smallest dimension of 0.5 $\mu$m with a tolerance of $\pm 0.05$ $\mu$m, and the pulse time is about 5 ns. The substrate velocity cannot be greater than 0.05 $\mu$m/5 ns or 1000 cm/s. A typical recovery time is about 0.1 s, and a typical distance between the centers of two immediately adjacent stepping fields is about 3 cm. Therefore, the substrate velocity is about 30 cm/s which is well below 1000 cm/s.

In an alternate embodiment of the present invention, the substrate stage does not move. The reticle is moved on a reticle stage in a fashion similar to the motion of the substrate stage as previously described. The velocity and path of the reticle must be controlled in a similar manner to the substrate stage motion previously described. In still another embodiment of the present invention, both the stage and the reticle move. The relative velocity and relative positioning between the substrate and the reticle must be known and controlled.

In the currently preferred embodiment of the present invention, the pulsed radiation source is a laser produced plasma x-ray source. The benefits of the present invention may be realized when other types of pulsed radiation sources, such as a pulsed ultraviolet radiation source. The radiation pulse used in the present invention typically has a wavelength between about 0.5 nm and about 300 nm. The composition of the resist may change according to the radiation source chosen, but the selection of resist materials for specific type of radiation is well known in the art. The number of radiation pulses needed to substantially pattern a resist layer may depend on the radiation source and the resist material. The number of radiation pulses needed is about equivalent to the total radiation dose needed to substantially pattern the resist layer divided by about the radiation dose incident on an exposed region of the resist layer from a radiation pulse.

If there is a wide variety of resist materials or radiation doses available, one can choose any number of pulses needed to substantially pattern a stepping field. The number of pulses chosen can be optimized according to one's needs. A short total patterning time and a small misalignment variance are desired. The total patterning time is proportional to the number of radiation pulses. The variance decreases as the times voted by positioning increases, but the incremental improvement for each additional vote has less of an effect on the variance compared to the previous vote because the variance is a function of about 1/N where N is the number of votes.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming a patterned resist layer on a semiconductor substrate comprising of steps of:

coating the substrate with a resist layer, the resist layer having a a stepping field, the stepping field having a center;

placing the substrate on a substrate stage in a lithographic printer including a pulsed radiation source, the pulsed radiation source emitting a radiation pulse lasting a pulse time and having a recovery time between two consecutive radiation pulses, the printer having a reticle disposed between the radiation source and the resist layer, the reticle having openings therein corresponding to exposure regions in the stepping field to be exposed to the radiation pulse, the reticle having a center;

patterning the stepping field of the resist layer using at least one radiation pulse during at least one pass of the reticle over the stepping field, the substrate moving relative to the reticle at a predetermined velocity during each of the at least one radiation pulse and configured so that the radiation source emits a radiation pulse when the center of the reticle is over about the center of the stepping field, the radiation pulse irradiating all of the exposure regions in the stepping field.

2. The method of claim 1, wherein the predetermined velocity is no greater than about a dimensional tolerance of the patterned resist layer divided by pulse time.

3. The method of claim 2, wherein the resist layer has a plurality of stepping fields including a first stepping field and a second stepping field immediately adjacent to the first stepping field, the first stepping field and the second stepping field each having a center, there being a distance between the centers, the predetermined velocity when moving from the center of the first stepping field to the center of the second stepping field is about equivalent to an amount calculated as follows:

adding the pulse time and the recovery time to form a sum; and dividing the distance between the centers by the sum.

4. The method of claim 3, wherein the plurality of stepping fields form a line and the substrate moves substantially continuously relative to the reticle until all stepping fields on the line are substantially patterned.

5. The method of claim 3, wherein the substrate moves substantially continuously relative to the reticle until all stepping fields of the resist layer are each patterned by a radiation pulse.

6. The method of claim 2, wherein the resist layer needs a total radiation dose to become substantially patterned, and wherein the resist layer is exposed with a number of radiation pulses per stepping field, the number of radiation pulses per stepping field being about equivalent to the total radiation dose divided by about the radiation dose incident on an exposed region of the resist layer from a radiation pulse.

7. The method of claim 6, wherein the radiation pulse has a wavelength between about 0.5 nm to about 300 nm.

8. The method of claim 7 further comprising the step of aligning the substrate to the reticle between any two radiation pulses for the same stepping field.

* * * * *